United States Patent
Hoffman

(10) Patent No.: US 6,362,676 B1
(45) Date of Patent: Mar. 26, 2002

(54) METHOD AND APPARATUS FOR A SINGLE EVENT UPSET (SEU) TOLERANT CLOCK SPLITTER

(75) Inventor: Joseph A. Hoffman, Chandler, AZ (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/559,661

(22) Filed: Apr. 28, 2000

Related U.S. Application Data

(60) Provisional application No. 60/131,926, filed on Apr. 30, 1999.

(51) Int. Cl.$^7$ .............................. G06F 1/04; H03K 3/00
(52) U.S. Cl. ......................... 327/295; 327/34; 327/293
(58) Field of Search ................................ 327/257, 258, 327/259, 291, 293, 295, 297, 415–417, 437, 34, 311, 328

(56) References Cited

U.S. PATENT DOCUMENTS 4,827,157 A * 5/1989 Machida et al. ............ 327/259
5,867,043 A * 2/1999 Kim .......................... 327/257
5,909,134 A * 6/1999 Sohn et al. ................. 327/295

* cited by examiner

*Primary Examiner*—Toan Tran
*Assistant Examiner*—Quan Tra
(74) *Attorney, Agent, or Firm*—Swidler Berlin Shereff Friedman, LLP

(57) ABSTRACT

A clock splitter circuit for providing a Single Event Upset (SEU) tolerant clock signals to latches in a space-based environment. The splitter circuit includes an event offset delay. The event offset delay receives an undelayed clock signal and generates an undelayed inverted clock, a delayed clock signal and an inverted delayed clock signal. The delayed clock signal and the inverted delayed clock signal are delayed by the known duration of Single Event Effects (SEE) on logic. The delayed and undelayed clock signals are passed to a pair of event blocking filters which block any disturbance in the undelayed and/or undelayed clock signals. The event blocking filters each generate a pair of in-phase inverted output signals. The event blocking filters are designed such that both pairs of outputs may not be low simultaneously. The in-phase output signals from each event blocking filter drive an inverting clock driver to provide a pair of SEU tolerant non-overlapping clock driver phase output signals to one or more latches.

31 Claims, 6 Drawing Sheets

METHOD AND APPARATUS FOR A SINGLE EVENT UPSET (SEU) TOLERANT CLOCK SPLITTER

RELATED APPLICATIONS

The present invention is related to U.S. patent application Ser. No. 09/559660 entitled "Method and Apparatus for a Scannable Hybrid Flip Flop" to Hoffman et al., and related to U.S. patent application Ser. No. 09/559659 entitled "Method and Apparatus for a Single Event Upset (SEU) Tolerant Clock Splitter" to Yoder et al., both filed coincident herewith and of common assignee to the present application, the contents of which are incorporated herein by reference in their entireties.

BACKGROUND OF THE INVENTION

1. Field of the Invention

The present invention is related to radiation hardened integrated circuits and, more particularly, to clock generation circuits for radiation hardened integrated circuits.

2. Related Art

Increasingly, space-based communication systems are including integrated circuits (IC) made in advanced deep sub-micron Field Effect Transistor (FET) technology. Typically, these ICs are in the insulated gate silicon technology commonly referred to as complementary metal oxide semiconductor (CMOS). CMOS ICs are advantageous in that they are high speed and low power. The CMOS ICs use little power compared to what other technologies require for comparable speed and function.

In a space-based environment, however, ionic strikes by sub-atomic cosmic particles are known to introduce circuit disturbances. These circuit disturbances are known as single event effects (SEE) and, as single event upsets (SEU) when corrupting data in storage elements. Radiation hardened latches are well known and are used, effectively, to reduce or to eliminate SEU in space-based IC registers, latches and other storage elements. These radiation hardened storage elements are designed to protect from disturbance what is stored in them in spite of any cosmic particle hits that the storage elements might sustain.

However, over time, as circuit performance has increased, the propagation delay through the logic between the radiation hardened latches or registers has been reduced to within an order of magnitude of the duration of an SEE. For example, a pipelined logic chip operating at 200 MHz can have 3–3.5 nanoseconds allocated for logic propagation delays between registers. A single event upset occurring in the logic can cause an invalid result for 0.5–1.0 nanoseconds because this is a significant amount of time with respect to a pulse width. Such an event occurring in a clock distribution chain causes a more widespread and potentially a much more serious result.

Typically, chip clocks are received by a receiver connected to a bonding pad of the IC. The receiver buffers and redrives the clock, typically, to multiple locations on the chip. At each of these locations, the clock is again buffered and redriven. This rebuffered clock can further distributed to multiple locations, where it can again be rebuffered and redriven. The clock distribution can be represented as a tree spreading out from the original receiver.

The effects from an event occurring in a clock tree can cause a transient in the clock signal on part of the clock tree of approximately 0.5 nanoseconds, which can appear as a false clock pulse. Further, the number of latches and registers affected by the false clock pulse is random and depends on where in the tree the event occurs. Such a false clock pulse can clock registers causing the registers to latch invalid data. The invalid latched data can be passed from the initial registers through the next logic stage. This can result in multiple uncorrectable multi-bit logic errors.

The severity of this problem only increases with greater levels of very large scale integration (VLSI) circuit integration because these higher levels of integration achieve higher performance through smaller features. For example, with circuits operating in the 1 GHz clock range, a single event could wipe out an entire clock cycle for the affected part of the IC logic. Thus, it can be seen that clock tree SEE immunity is critical to preventing logic errors.

For example, FIG. 1 illustrates a typical state of the art scan d-flip-flop (scan dff) 100. The scan d flip-flop 100 includes a 2:1 multiplexer 102, which is coupled to a first level sensitive latch 104. The first level sensitive latch 104 is coupled to a second level sensitive latch 106. The scan dff 100 is clocked by a clock signal 107. The clock signal 107 is split into complementary signals by inverting clock signal 107 with inverter 108. The complementary clock signals are provided to first level sensitive latch 104 and second level sensitive latch 106, gating first and second pairs of pass gates 110, 112 and 114, 116, respectively.

When selected, an input DATAIN 118 passes through the 2:1 multiplexer 102 to the first pair of pass gates 110, 112 as complementary outputs 120, 122 of multiplexer 102. When the clock signal 107 is low, pass gates 110, 112, are turned on so that data and complementary outputs 120, 122 are passed to first level sensitive latch 104 and, tentatively, are stored therein. With the clock signal 107 low, the second pair of pass gates 114, 116 are contemporaneously turned off, and isolate the second level sensitive latch 106 from outputs 124, 126 of the first level sensitive latch 104.

The rising edge of clock signal 107 turns on the second pair of pass gates 114, 116 as the output of inverter 108 falls, simultaneously, to turn off the first pair of pass gates 110, 112. When the first pair of pass gates 110, 112 are turned off, the complementary outputs 120, 122 are isolated from the first level sensitive latch 104 and, so, data is latched in the first level sensitive latch 104. When the second pair of pass gates 114, 116 are turned on, outputs 124, 126 of the first level sensitive latch 104 are passed to the second level sensitive latch 106. The state of outputs 124, 126, is stored, tentatively, in the second level sensitive latch 106 and, simultaneously, is passed out on an output DATAOUT 128. When clock signal 107 falls, on the next clock cycle, the second pair of pass gates 114, 116 are turned off, isolating the second level sensitive latch 106 from the outputs 104, 126 of first level sensitive latch 104, latching data in the second level sensitive latch 106 to complete the clock cycle.

Normally, when the clock signal 107 is well behaved with regularly spaced high and low periods, it is sufficient that data provided to the input DATAIN 118 meet a setup (i.e., be valid for a specified period prior to the rise of clock signal 107) and hold (i.e., remain valid for a specified period after the rise of clock signal 107) timing requirements. At any time, other than this window around clock signal 107 rising, the state of input DATAIN 118 is specified as a "don't care" condition.

Unfortunately, an upsetting event occurring in the clock tree prior to clock signal 107 can cause a false clock pulse on clock signal 107. Since input DATAIN 118 is specified as a "don't care," a falling edge of a false clock pulse on clock signal 107 could cause the first level sensitive latch 104 to switch states, inadvertently storing data. Further, when the input clock returns high, that invalid level can be passed to the second level sensitive latch 106 and out of the scan dff 100 on output DATAOUT 128. The false clock pulse is a pulse perturbated by an SEE.

Thus, for reasons stated above, and for other reasons stated below, which will become apparent to those skilled in the relevant art upon reading and understanding the present specification, what is needed are clock generation circuits with reduced SEE sensitivity.

SUMMARY OF THE INVENTION

The above mentioned problems with clock generation circuits and radiation hardened storage elements and other problems are addressed by the present invention and which will be understood by reading and studying the following specification.

Briefly, the present invention is a clock splitter circuit for providing a Single Event Upset (SEU) tolerant clock for clocking latches in a space-based environment. The splitter circuit can include an event offset delay circuit. The event offset delay circuit can receive an undelayed clock signal and generate an inverted undelayed clock signal, a delayed clock signal and an inverted delayed clock signal. The delayed clock signal and inverted delayed clock signal are delayed by a known duration of Single Event Effects (SEE) on logic. The delayed and undelayed clock signals can be passed to a pair of event blocking filters. SEE induced signal perturbations that may be present in the delayed, undelayed, inverted and uninverted clock signals can be blocked by the pair of event blocking filters. Each event blocking filter generates a pair of in-phase inverted clock output signals. An output of each of the event blocking filters is cross-coupled to an input of the other, such that the pairs of in-phase inverted clock output signals are not low simultaneously. Each pair of in-phase inverted clock output signals drives one of a pair of inverting clock drivers. Thus, the pair of inverting clock drivers provide a complementary pair of SEU tolerant non-overlapping clock output signals to one or more latches from a single undelayed input clock signal.

In an embodiment of the present invention, a clock splitter circuit includes an event offset delay circuit, and a first event blocking filter and a second event blocking filter coupled to the event offset delay circuit.

In one embodiment of the present invention, the circuit can further include a first clock driver and a second clock driver coupled to the first event blocking filter and the second event blocking filter.

In one embodiment of the present invention, the event offset delay circuit includes first, second, third, fourth and fifth inverters coupled in series, where an input to the first inverter is an undelayed clock signal and an output of the first inverter is an inverted undelayed clock signal, where an output of the fourth inverter is a delayed clock signal, where an output of the fifth inverter is an inverted delayed clock signal, where the undelayed clock signal and the delayed clock signal are coupled to the first event blocking filter, and where the inverted undelayed clock signal and the inverted delayed clock signal are coupled to the second event blocking filter.

In one embodiment of the present invention, each of the first and the second event blocking filters includes three series coupled PFETs, a PFET coupled in parallel with two of the three series connected PFETs, and four series coupled NFETs, a drain-source region of one of the four series coupled NFETs being coupled at a first of two in-phase outputs of the event blocking filter to a drain-source region of a third PFET of the three series coupled PFETs, a source-drain region of the third PFET being coupled to a second of the two in-phase outputs.

In one embodiment of the present invention, the first PFET of the three series coupled PFETs is gated by the delayed clock signal and the second PFET of the three series coupled PFETs is gated by undelayed clock signal.

In one embodiment of the present invention, a gate of the third PFET is coupled to ground.

In one embodiment of the present invention, a gate of the parallel connected PFET is driven high to enable the event blocking filter.

In one embodiment of the present invention, each of the first and second clock drivers is an inverting clock driver and where each of the clock drivers includes a PFET, a source-drain region of the PFET coupled to a supply voltage, a gate of the PFET gated by the first of the in-phase outputs of the event blocking filter, and an NFET, a source-drain region of the NFET coupled to ground, a gate of the NFET gated by the second of the in-phase outputs, a drain-source region of the PFET coupled to a drain-source region of the NFET and coupled to an output of the clock driver.

In one embodiment of the present invention, a clock splitter circuit for providing an SEU tolerant clock to latches in a space-based environment is disclosed, where the clock splitter circuit includes an event offset delay circuit receiving an undelayed clock signal and generating a delayed clock signal and the undelayed clock signal, a first event blocking filter receiving and combining the undelayed clock signal and the delayed clock signal to provide a first and a second of two in-phase outputs, and a first clock driver being driven by the first and the second in-phase outputs to provide a clock driver output signal.

In one embodiment of the present invention, the circuit further includes a second event blocking filter receiving an undelayed inverted clock signal and a delayed inverted clock signal from the event offset delay circuit, and a second clock driver being driven by the second event blocking filter.

In one embodiment of the present invention, the event offset delay circuit generates the undelayed inverted clock signal and a delayed inverted clock signal, the undelayed clock signal and the delayed clock signal being provided to one of the first and the second in-phase outputs and the undelayed inverted clock signal and the delayed inverted clock signal being provided to the other of the first and the second in-phase outputs.

In one embodiment of the present invention, a low signal at one of the first and the second in-phase outputs of the first and the second event blocking filters prevents the other of the first and the second in-phase outputs from being pulled low.

In one embodiment of the present invention, the event offset delay circuit is a series of coupled inverters.

In one embodiment of the present invention, the event offset delay circuit is 5 series coupled inverters, the undelayed inverted clock signal being an output of a first of the 5 series coupled inverters, the delayed clock signal being an output of a fourth of the 5 series coupled inverters and the delayed inverted clock signal being an output of a fifth of the 5 series coupled inverters.

In one embodiment of the present invention, each of the first and the second event blocking filters includes three series coupled devices of a first conduction type, four series coupled devices of a second conduction type, a conduction terminal of one of the three series coupled devices being coupled to a conduction terminal of the four series coupled devices, and a device of the first conduction type being coupled in parallel with two of the three series coupled devices.

In one embodiment of the present invention, one of the first and the second in-phase outputs is at a coupling point of the parallel coupled device and the other of the pair of in-phase outputs is at the coupled of the three series coupled devices with the four series coupled devices.

In one embodiment of the present invention, the devices of the first conduction type are P-type field effect transistors (FETs) and the devices of the second conduction type are N-type FETs, the first and the second in-phase outputs being separated by one of the three series coupled PFETs with its gate coupled to ground.

In one embodiment of the present invention, a clock splitter circuit for providing an SEU tolerant clock to latches in a space-based environment is disclosed, where the clock splitter circuit includes an event offset delay means for generating an undelayed inverted clock signal, a delayed clock signal and a delayed inverted clock signal responsive to an undelayed clock signal, the delayed clock signal being delayed from the undelayed clock signal and the inverted delayed clock being delayed from the undelayed inverted clock signal by a period of at least equal to a single event effect duration, and a pair of event blocking filters means for blocking single event effects in the undelayed clock signal, the undelayed inverted clock signal, the delayed clock signal or the delayed inverted clock signal and generating a pair of in-phase clock output signals therefrom.

In one embodiment of the present invention, the circuit further includes a pair of clock driver means for providing a pair of non-overlapping clock signals responsive to a corresponding pair of in-phase clock output signals from the event blocking filters means.

In one embodiment of the present invention, each of the pair of event blocking filter means includes enable means for enabling the event blocking filter, feedback means for preventing the in-phase outputs from the event blocking filter from switching, resistive means for resistively isolating the pair of in-phase outputs from the event blocking filter means, and means for comparing the delayed clock signal with the undelayed clock signal, the pair of in-phase clock output signals being generated responsive to the delayed and undelayed clock signals.

In one embodiment of the present invention, an integrated circuit (IC) chip for space-based operation is disclosed, including an SEU tolerant clock splitter, the clock splitter includes an event offset delay generating an undelayed inverted clock signal, a delayed clock signal and a delayed inverted clock signal responsive to an undelayed clock signal, the delayed clock signal being delayed from the undelayed clock signal and the the inverted delayed clock being delayed from the undelayed inverted clock signal by a period of at least equal to a single event effect duration, and a pair of event blocking filters each generating a coupled pair of in-phase clock output signals, a first of the pair of event blocking filters receiving the undelayed clock signal and the delayed clock signal, generating a pair of inverted in-phase clock output signals and blocking single event effects from passing to the pair of generated inverted in-phase clock output signals, a second of the pair of event blocking filters receiving the undelayed inverted clock signal and the delayed inverted clock signal, generating a pair of uninverted in-phase clock output signals and blocking single event effects from passing to the pair of generated uninverted in-phase clock output signals, where the clock output in-phase signals from one of the pair of event blocking filters are low preventing the in-phase clock output signals from an other of the pair of event blocking filters from being driven low.

In one embodiment of the present invention, the integrated circuit chip further includes a pair of inverting clock drivers, the in-phase clock output signals from each of the pair of event blocking filters being coupled to a corresponding one of the pair of inverting clock drivers, each of the pair of inverting clock drivers providing a pair of non-overlapping clock output signals.

In one embodiment of the present invention, each of the pair of event blocking filters includes a pair of series coupled PFETs, the pair being gated by the delayed and the undelayed clock signals, a PFET coupled in parallel with the pair of series coupled PFETs between a supply voltage and a first of the pair of in-phase clock output signals, the parallel coupled PFET being gated by an enable signal, a grounded gate PFET, a source-drain region of the grounded gate PFET being coupled to the first of the pair of in-phase clock output signals, the drain-source region of the grounded gate PFET being coupled to a second of the pair of in-phase clock output signals, and four series coupled NFETs coupled between the second of the in-phase clock output signals and ground, a gate of one of the NFETs being coupled to the second of the pair of in-phase outputs of the other of the pair of the event blocking filters.

In one embodiment of the present invention, each of the clock drivers includes a PFET, a source-drain region of the PFET coupled to a supply voltage, a gate of the PFET gated by the first of the pair of in-phase clock output signals, and an NFET, a source-drain region of the NFET coupled to ground, a gate of the NFET gated by the second of the pair of in-phase clock output signals, a drain-resource region of the PFET coupled to a drain-source region of the NFET and coupled to a clock driver output.

In one embodiment of the present invention, a method of clocking an integrated circuit chip is disclosed including generating an undelayed complementary pair of clock signals, generating a delayed complementary pair of clock signals, generating a first in-phase clock signal pair from an uninverted undelayed clock signal of the undelayed complementary pair of clock signals and an uninverted delayed clock signal of the delayed complementary pair of clock signals, and generating a second in-phase clock signal pair from an inverted undelayed clock signal of the undelayed complementary pair of clock signals and an inverted delayed clock signals of the delayed complementary pair of clock signals.

In one embodiment of the present invention, the method further includes generating a first latch clock signal from the first in-phase clock signal pair, and generating a second latch clock signal from the first in-phase clock signal pair, the first and the second latch clock signals clocking the integrated circuit.

In one embodiment of the present invention, the first and second latch clocks are non-overlapping clocks.

In one embodiment of the present invention, both the first and the second in-phase clock signal pairs must be high before either can be pulled low.

In one embodiment of the present invention, the step of generating the delayed complementary pair of clock signals further includes enabling clock generation.

In one embodiment of the present invention, a clock splitter circuit is disclosed including an event offset delay circuit and first and second event blocking filters coupled to the event offset delay circuit and generating a pair of undelayed complementary clocks signals, where an upset occurring in an input clock tree prior to the first and the second event blocking filters is not propagated to the pair of undelayed complementary clock signals.

In one embodiment of the present invention, the event offset delay circuit includes first, second, third, fourth and fifth inverters coupled in series, where an input to the first inverter is an undelayed clock signal and an output of the first inverter is an inverted undelayed clock signal, where an output of the fourth inverter is delayed from undelayed clock signal by a delay approximately equal to a duration of an upset, where an output of the fifth inverter is an inverted delayed clock signal delayed from the inverted undelayed clock signal by a delay approximately equal to the duration of an upset, where the undelayed clock signal and the delayed clock signal are coupled to the first event blocking filter, and where the inverted undelayed clock signal and the inverted delayed clock signal are coupled to the second event blocking filter.

It is an advantage of the invention that integrated circuit chip SEE sensitivity can be reduced.

It is another advantage of the invention that integrated circuit power can be reduced.

It is yet another advantage of the invention that integrated circuit chip clock tree SEE sensitivity can be reduced.

It is yet another advantage of the invention that timing related SEU sensitivity is reduced on space-based integrated circuit chips.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages of the invention will be apparent from the following, more particular description of a preferred embodiment of the invention, as illustrated in the accompanying drawings.

DETAILED DESCRIPTION OF AN EXAMPLE EMBODIMENT OF THE INVENTION

In the following detailed description of illustrative embodiments of the present invention, reference is made to the accompanying drawings which form a part hereof, and in which are shown by way of illustration specific illustrative embodiments in which the invention can be practiced. These embodiments are described in sufficient detail to enable those skilled in the art to practice the invention, and it is to be understood that other embodiments can be used and that logical, mechanical and electrical changes can be made without departing from the spirit and scope of the present invention. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high, however, an asterisk (*) following the signal name in this application indicates that the signal is negative or inverse logic. Negative or inverse logic is considered active when the signal is low.

Figure 1:
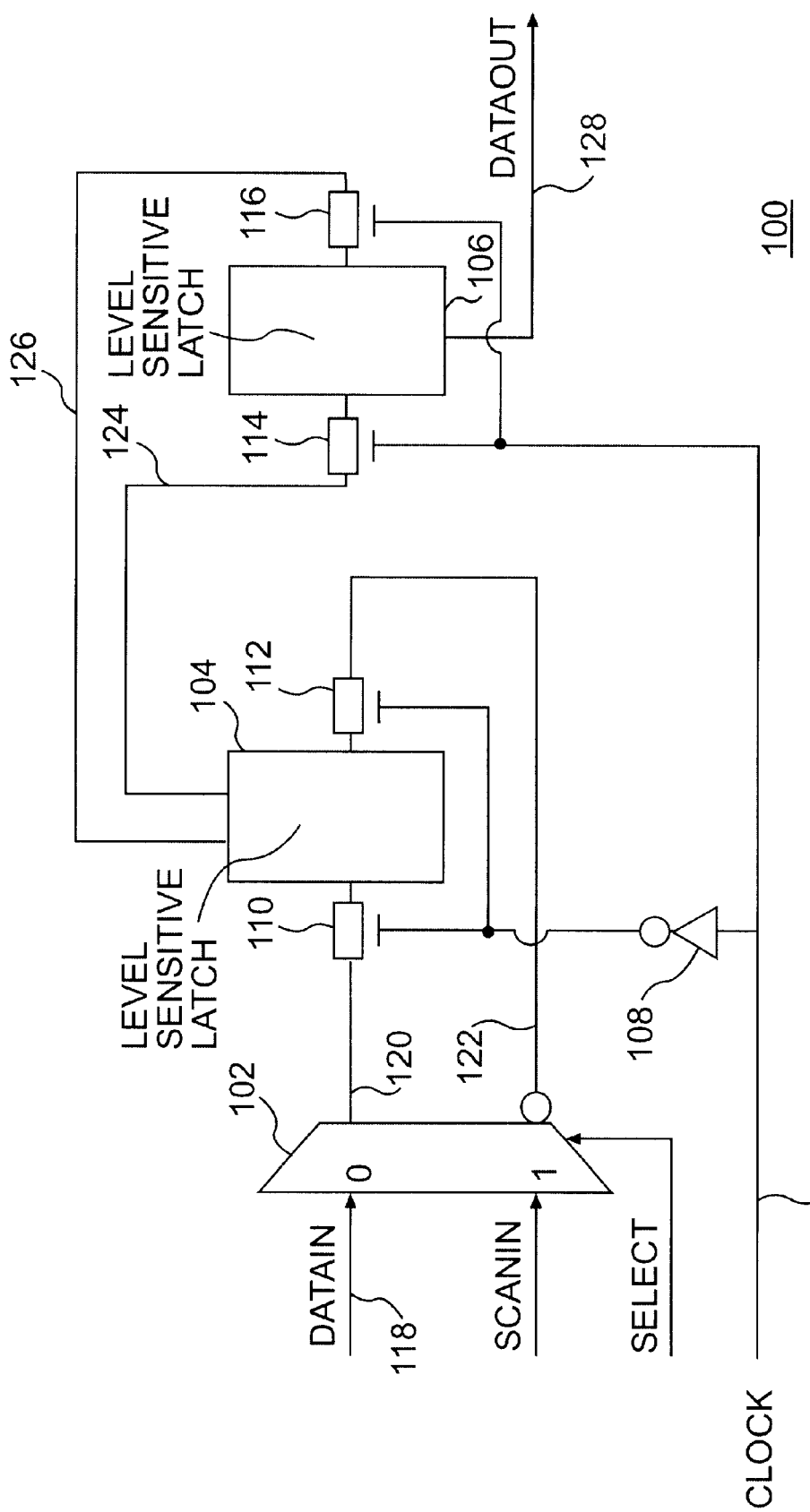
FIG. 1 is an example block diagram of a conventional scan d-flip-flop.
Figure 2:
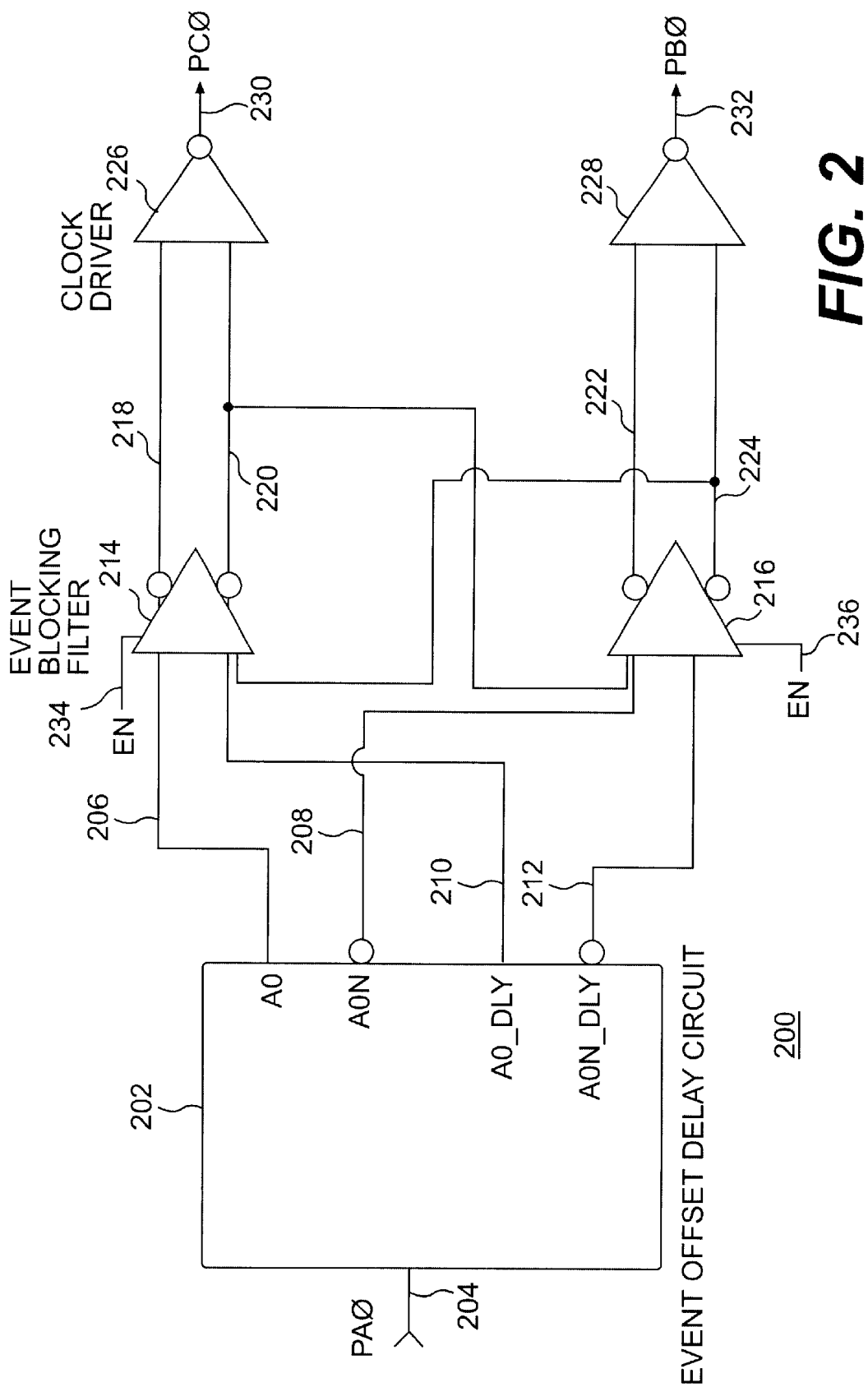
FIG. 2 is a block diagram of an exemplary embodiment of a single event upset (SEU) tolerant clock splitter circuit.

Turning now to the drawings and, more particularly, FIG. 2 is a block diagram of an exemplary embodiment of a single event upset (SEU) and single event effect (SEE) tolerant clock splitter circuit 200. The SEU tolerant clock splitter circuit 200 of the present invention avoids the SEE sensitivity of inverter 108 of FIG. 1 and avoids false pulses from SEUs occurring in conventional clock tree circuits. The exemplary embodiment of clock splitter circuit 200 includes an event offset delay circuit 202 that receives an input clock signal 204 and provides two pairs of complementary undelayed output signals AO 206, AON 208 and delayed output signals AO_DLY 210, AON_DLY 212. Output signals AO 206 and AO_DLY 210 are inputs to an inverting event blocking filter 214. Output signals AON 208 and AON_DLY 212 are inputs to a second inverting event blocking filter 216. Output signals 218, 220 and 222, 224 of event blocking filters 214 and 216 are inputs to inverting clock drivers 226, and 228, respectively. The inverting event blocking filters 214 and 216, each have enable signals 234 and 236, respectively. Inverting clock drivers 226 and 228 each provide one of a pair of complementary non-overlapping clock phase output signals PCO 230 and PBO 232, respectively.

Inverting event blocking filter 214 compares undelayed output signal AO 206 with delayed output signal 210. Inverting event blocking filter 216 similarly compares undelayed output signal AON 208 and delayed output signal AON_DLY 212. In response to these comparisons each event blocking filter 214, 216 outputs a pair of inverted outputs 218, 220 and 222, 224, respectively. Output signal 220 from inverting event blocking filter 214 is passed as a feedback input to inverting event blocking filter 216. Output signal 224 from inverting event blocking filter 216 is passed as a feedback input to event blocking filter 214.

The outputs 218, 220 and 222, 224 of each of inverting event blocking filters 214, 216, respectively, do not switch state until all inputs 206, 210 and 224, 208, 212 and 236, respectively, are at the same logic level. Thus, both output signals 206, 210 and, coincidentally, signals 208, 212 must have switched states before output signals 218, 220 and 222, 224 switch. The delay of the event offset delay circuit 202 is sized such that the delayed output signals 210 and 212 are delayed from undelayed output signals 206 and 208, respectively, by $t_{SEE}$, typically 0.5 ns for 0.5 μm logic.

Accordingly, a false clock pulse will never cause the inverting event blocking filters 214, 216, to switch because the delay of event offset delay circuit 202 insures that a false pulse perturbated by an SEE is not on both the undelayed output signals 206, 208 and the delayed output signals 210, 212, simultaneously. Thus, the inverting clock drivers 226, 228 ignore a false low pulse on either output of inverting event blocking filters 214, 216. The exemplary clock splitter circuit 200 thereby avoids inadvertently driving the PC0 clock output 230 of clock driver 226 or PB0 clock output 232 of clock driver 228 high in response to a SEE.

The feedback input to event blocking filters 214, 216 must be high in order to drive the outputs 218, 220 and 222, 224 low. So, output pairs 218, 220 and 222, 224, respectively, of event blocking filters 214, 216 must be high before either pair can be driven low. Thus, when these in phase output signal pairs 218, 220 and 222, 224 are inverted by inverting clock drivers 226 and 228, the resulting pair of complementary clock phase output signals PCO 230, PBO 232 are never high simultaneously and, therefore, are non-overlapping.

Figure 3:
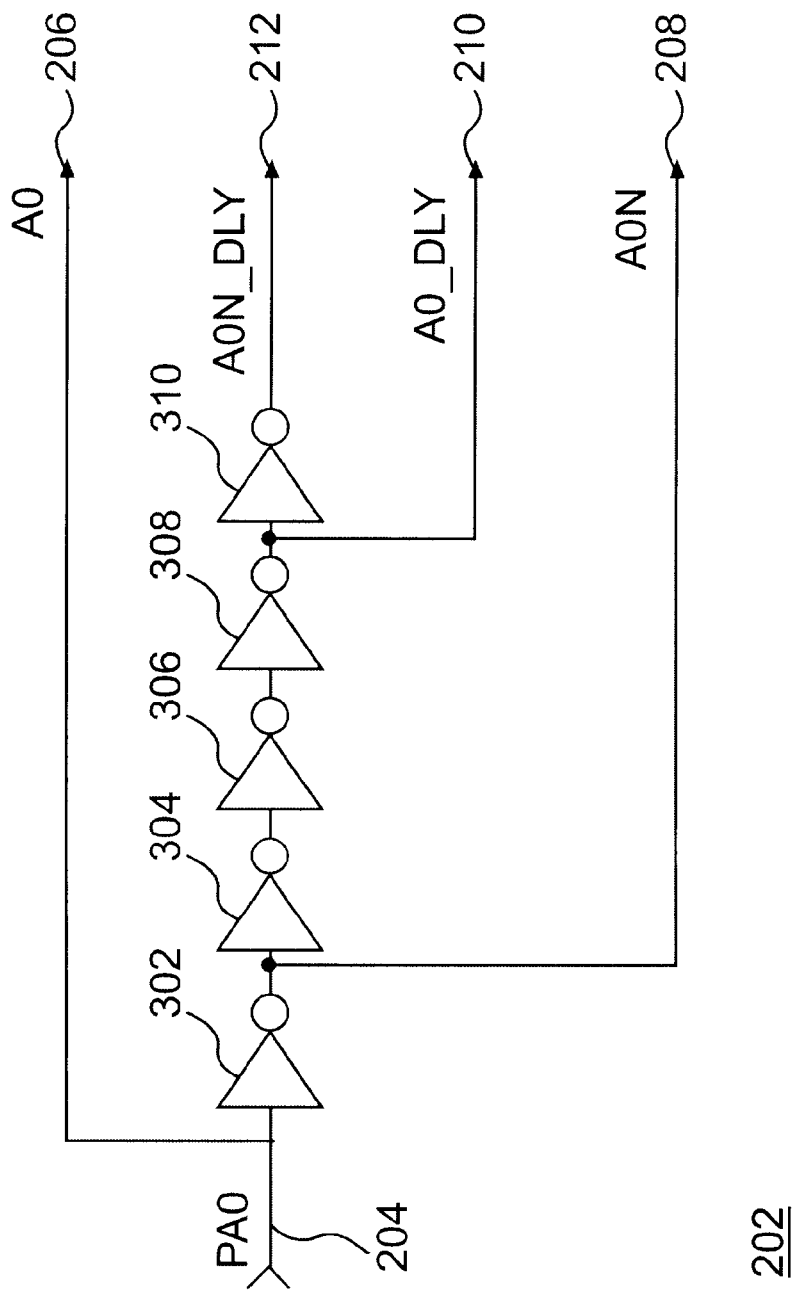
FIG. 3 is a schematic diagram of an exemplary embodiment of an event offset delay circuit.

FIG. 3 illustrates an exemplary embodiment of an event offset delay circuit 202. As noted above, a preferred event offset delay circuit 202 is carefully sized to introduce a delayed input signal, wherein the delay is $t_{SEE}$. Although any suitable delay circuitry capable of providing the desired delay can be used, preferably, the event offset delay circuit 202 is formed by a series of inverters 302, 304, 306, 308 and 310. For this embodiment, $t_{SEE}$ is less than four times the delay through an inverter. The input clock signal PAO 204 is passed forward as an undelayed, uninverted output signal AO 206. The input clock signal PAO 204 also propagates through four inverters 302, 304, 306 and 308 to provide the delayed, uninverted output signal AO_DLY 210. The output of the first inverter 302 is passed forward as an undelayed, inverted output signal AON 208. The output of the fifth inverter 310 is delayed inverted output signal AON_DLY 212, which is also delayed from undelayed, inverted output signal AON 208 by stage delays from four inverters 304, 306, 308 and 310.

Figure 4:
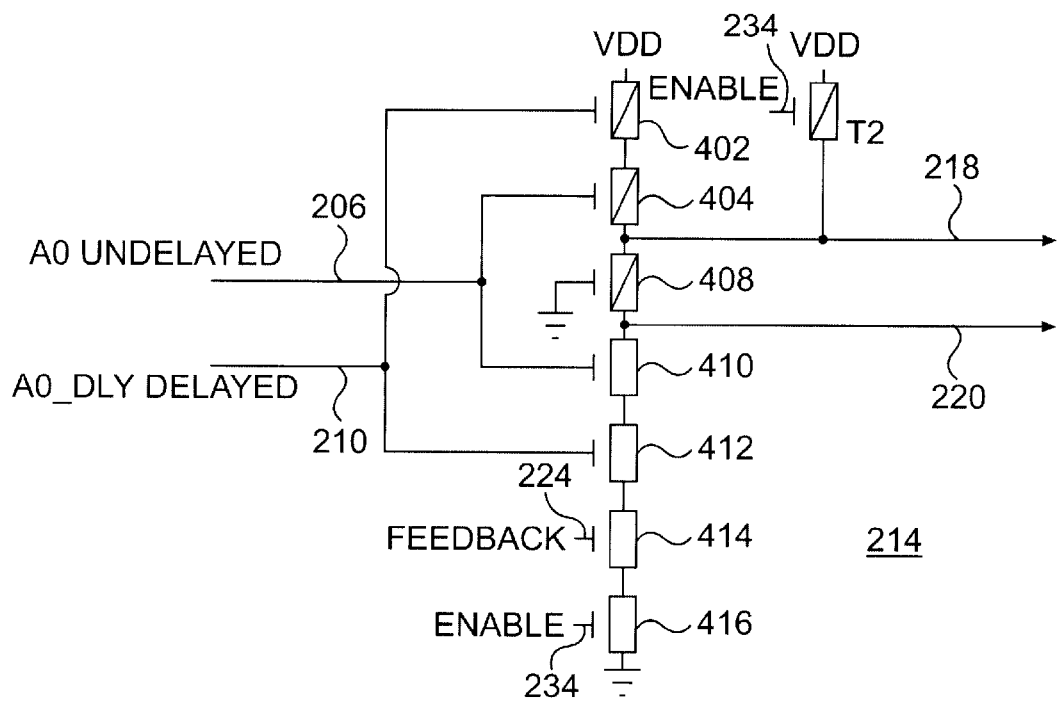
FIG. 4 is a schematic diagram of an exemplary embodiment of an inverting event blocking filter.

FIG. 4 is an exemplary embodiment of a schematic diagram of an event blocking filter 214. A preferred event blocking filter 214 can include two series connected P-type field effect transistors (PFETs) 402, 404 in parallel with PFET 406, further in series with PFET 408. A drain-source region of PFET 402 can be coupled to a source-drain region of PFET 404. Source-drain regions of PFETs 402 and 406 are tied to a supply voltage, such as, e.g., (VDD). A drain-source region of PFET 408 can be coupled to a drain-source region of N-type field effect transistor (NFET) 410 which is one of four series coupled NFETs 410, 412, 414 and 416. A source-drain region of NFET 410 can be coupled to a drain-source region of NFET 412, which has its source-drain region connected to a drain-source region of NFET 414. A source-drain region of NFET 414 can be coupled to a drain-source region of NFET 416. A source-drain region of NFET 416 can be tied to ground. The drain-source region of PFETs 404 and 406 are coupled to a source-drain region of PFET 408 and a first output 218 of the pair of in-phase outputs. The PFET 408 has a drain-source region to the drain-source region of NFET 410 and a second output 220 of the pair of in-phase outputs. It will be apparent to those skilled in the art that FIG. 4 can also depict an embodiment of event blocking filter 216.

An undelayed output, i.e. 206 of event offset delay circuit 202 of FIG. 2, is a first clock input at the gate of PFET 404 and the gate of NFET 410. A corresponding delayed output, 210, is a second clock input 210 at the gate of PFET 402 and NFET 412. An enable signal input 234 is provided to the gate of parallel PFET 406 and the gate of NFET 416. The gate of PFET 408 can be grounded coupling it on. A feedback input 224 is provided to the gate of NFET 414. As noted hereinabove, output signals 220 and 224 from event blocking filters 214 and 216, respectively, are cross-coupled as inputs to the other event blocking filter 216 and 214, respectively. Specifically, output 220 from event blocking filter 214 is the feedback signal input 220 for the other event blocking filter 216. Similarly, output 224 of event blocking filter 216 is the feedback signal input 224 to event blocking filter 214.

When the enable input 234 is low, outputs 218 and 220 are held high. NFET 416 is off, blocking the path to ground from output 220. PFET 406 is on, holding in-phase output 218 high at VDD. Depending on its operational bias conditions, PFET 408 acts as a resistor or as a diode, coupling together in-phase outputs 218 and 220. Because output 218 held high by PFET 406, PFET resistor 408 pulls output 220 high and holds output 220 high. The state of other inputs is a "don't care."

When the enable signal input 234 is driven high to enable the event blocking filter 214, PFET 406 is turned off and NFET 416 is turned on supplying ground to the source-drain region of NFET 414. Initially, the feedback line 224 is high because the output of the previously not enabled filter 216 is high. The event offset delay circuit 214 compares the input clock phases 206 and 210 and, in response to the comparison, inverts and passes the clock signal on outputs 218 and 220. If both clock inputs 206, 210 are low, NFETs 410 and 412 remain off, PFETs 402 and 404 remain on and both outputs 218 and 220 remain high.

However, if both inputs 210, 206 are high when the event blocking filter 214 is enabled, PFETs 402 and 404 are off and NFETS 410 and 412 are on. NFET 414, being on, passes ground to the source-drain region of NFET 412. So, with all NFETs 410, 412, 414 and 416 on, in-phase output 220 is pulled low to ground. With the drain-source region of PFET 408 grounded, $V_{DS}=V_{GS}$ and PFET 408 acts as a diode to pull the other in-phase output 218 down. However, since PFET 408 acts as a diode, in-phase output 218 is not pulled completely to ground, but to a voltage equal to the magnitude of the threshold voltage (the diode voltage) of PFET 408.

Thus, with the outputs 218, 220 of one event blocking filter 214 being low, the feedback input 220 to the other event blocking filter 216 also is low. Similarly, with outputs 222 and 224 of event blocking filter 216 being low, the feedback input 224 to event blocking filter 214 also is low. In the event blocking filter 214 with its feedback input 224 low, NFET 414 is off, closing the path to ground, which prevents the outputs 218, 220 from switching low. So, as long as the feedback input 224 is low, the event blocking filter 214 clock inputs 210, 206 are ignored and outputs 218, 220 stay high. The event blocking filter 214 cannot switch until the feedback input 224 is high. Cross coupling these outputs 220, 224 guarantees that there is some period during switching when the in-phase outputs 218, 220 and 222, 224 are high, simultaneously. Therefore, the clocks 230, 232 from inverting drivers 226 and 228, respectively, are never both high and so, are non-overlapping.

Event blocking filter 216 has inputs 208, 220 and 212 corresponding to inputs 206, 224 and 208, respectively, of FIG. 4. Event blocking filter 216 also has outputs 222 and 224 corresponding to outputs 218 and 220, respectively, of FIG. 4.

It should be noted that if a clock enable 234 is unnecessary, NFET 416 and PFET 406 can be omitted. Also, the feedback 224 between clocks can be omitted by omitting NFET 414.

Figure 5:
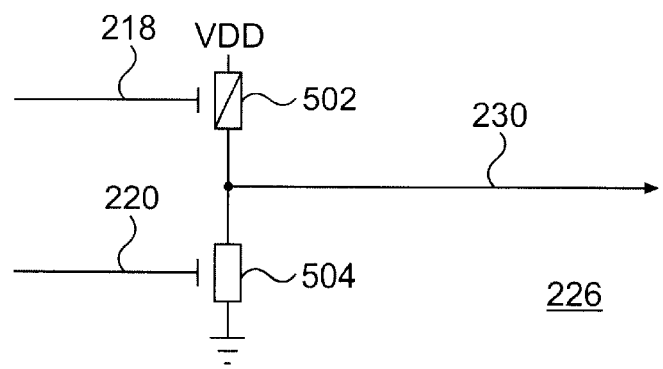
FIG. 5 is a schematic diagram of an exemplary embodiment of an inverting clock driver circuit.

FIG. 5 is a schematic diagram of an inverting driver 226 such as can be used for inverting clock drivers 226 and 228 of the exemplary embodiment of clock splitter circuit 200. The inverting clock driver 226 can include a PFET 502 and an NFET 504 coupled together at their drain-source regions and coupled to the clock output PCO 230. The source-drain region of the PFET 502 can be coupled to VDD and the source-drain region of the NFET 504 can be coupled connected to ground. The input 218 to the gate of PFET 502 can be one in-phase output 218 of event blocking filter 214. The input 220 to the gate of NFET 504 can be driven from the other in-phase output 220 of event blocking filter 214. It should be noted because PFET 408 is acting as a diode when event blocking filter outputs 218, 220 are low, the gate of PFET 502 is never pulled completely to ground and, so, sees a reduced drive, when it is turned on. For inverting clock driver 228, input 218 of FIG. 5 corresponds to input 222, input 220 corresponds to input 224, and output 230 corresponds to output 232 of inverting clock driver 228.

Figure 6:
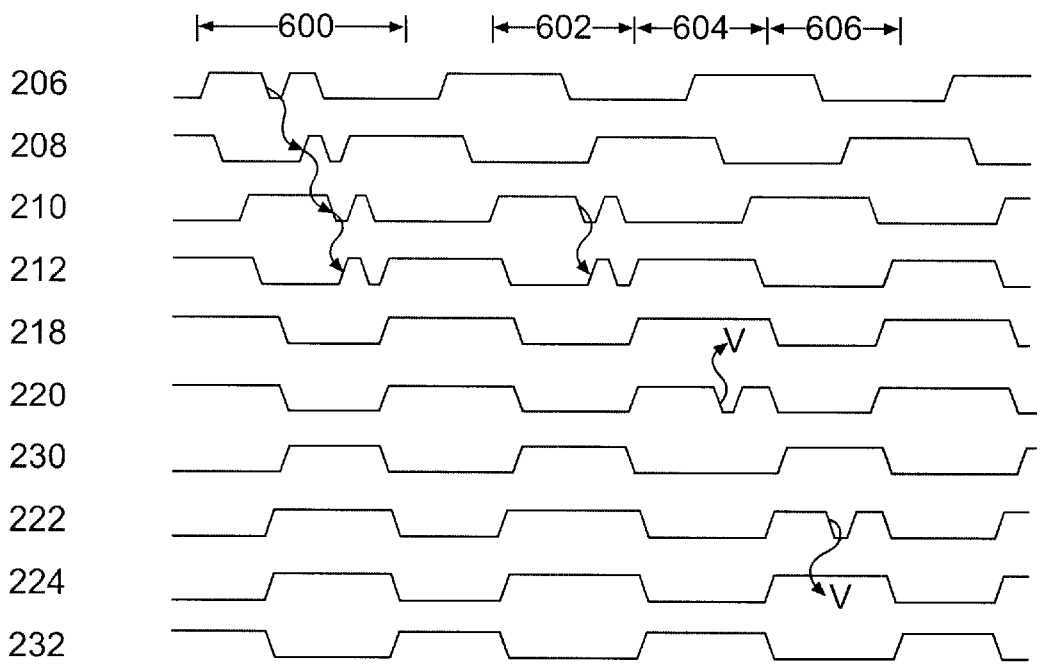
FIG. 6 is a timing diagram illustrating an example of events occurring at various locations prior to and within the exemplary embodiment of the SEU tolerant clock splitter circuit.

FIG. 6 is a timing diagram that illustrates events occurring in the clock tree prior to, as well as within the exemplary embodiment SEU tolerant clock splitter circuit 200. The period labeled 600 represents an SEU occurring in the timing tree, prior to the preferred embodiment SEU tolerant clock splitter circuit 200. The event causes a false clock pulse shown in the figure that propagates, as represented by the arrows, through the event offset delay 202. However, because the propagation delay through the event offset delay 202 is the same length as the SEU, the event edges never line up such that the event blocking filters 214, 216 would switch. Accordingly, the event blocking filters 214, 216 have filtered out the SEU and nothing is reflected on either pair of event blocking filter outputs 218, 220 or 222, 224 or on the clocks 230, 232 generated therefrom.

Next, in the period labeled 602, an upset is shown occurring in the event offset delay 202 at, for example, inverter 306 in FIG. 3. Just as with the event occurring prior to the event offset delay 202 in period 600, this upset in the event offset delay 202 is blocked at the event blocking filters 214, 216 by the undelayed clock input.

In the period labeled 604, an upset is shown on the in-phase output 220 of event offset filter 214. While the upset output 220 is discharged and pulled low, the other in-phase output 218 is only minimally pulled below VDD. Since both PFETs 402 and 404 of FIG. 4 are on, they form a voltage divider with on PFET 408, limiting how low PFET 408 can pull output 218. PFETs 402 and 404 are designed to have a smaller active resistance than PFET 408 and, therefore, prevent PFET 408 from pulling output 218 much below VDD.

Finally, in the period labeled 606, an upset is shown on the output 222 of event blocking filter 216. While the upset is of sufficient magnitude to pull the output 222 low turning on PFET 502 of inverting clock driver 228, output 224 remains high keeping NFET 504 of inverting clock driver 228 on. NFET 504 is designed to be large enough to maintain a low output on line 232 under these conditions. PFET 408, acting as a diode, pulls the other event offset filter output down, slightly, but not enough to turn driver NFET 504 off, sufficiently that the clock output 230 might rise to a level of any concern. Accordingly, the SEE never reaches latches that the clocks 230, 232 are clocking.

Figure 7B:
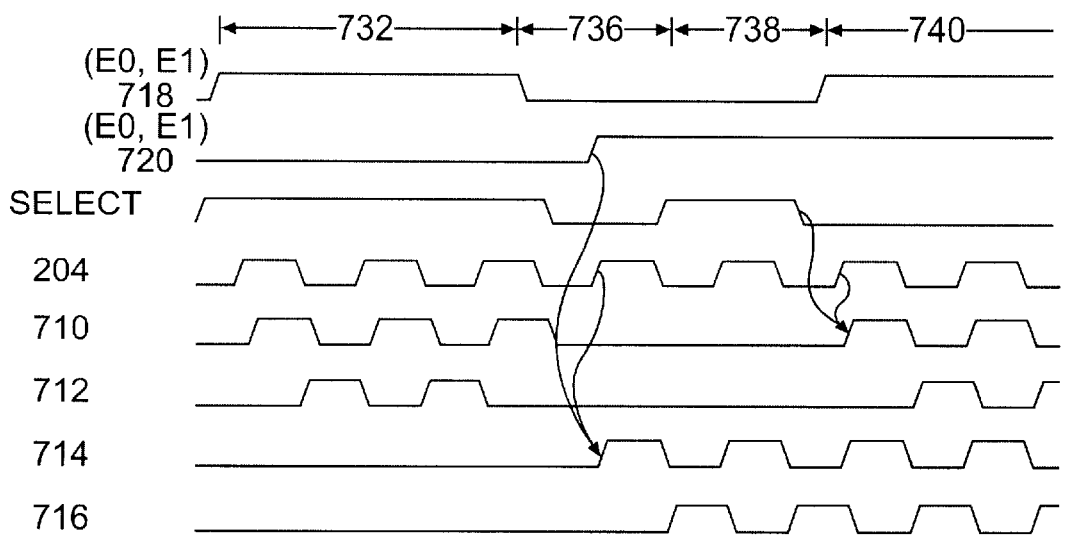
FIG. 7B is an example timing diagram for the IC illustrated in FIG. 7A.
Figure 7A:
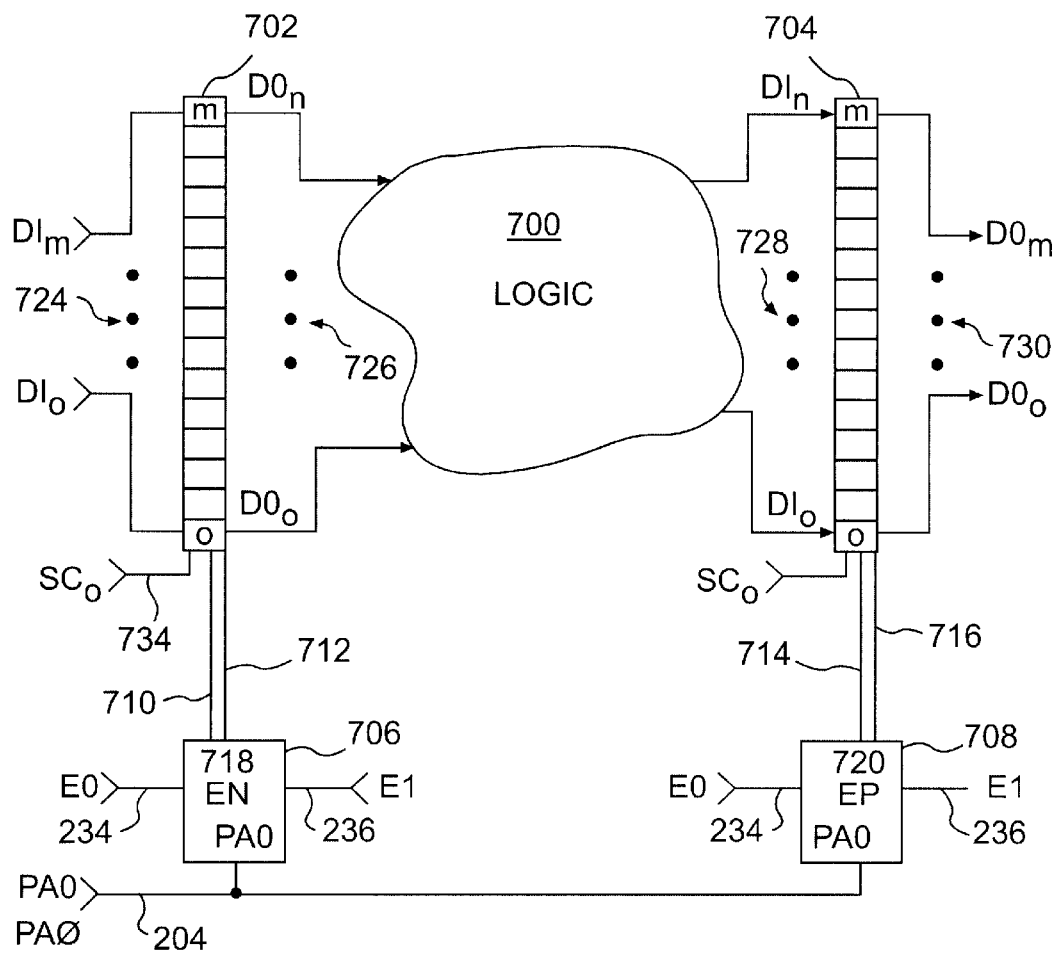
FIG. 7A is a cross sectional diagram of an exemplary embodiment of an integrated circuit (IC) chip for space-based applications with level sensitive scan design (LSSD) testable logic between two registers according to the present invention.

FIG. 7A is a cross sectional view of an exemplary embodiment of an integrated circuit (IC) chip for space-based applications. Level sensitive scan design (LSSD) testable logic 700 is bounded by two serially scannable registers 702, 704. Each register 702, 704, is clocked by an independent clock driver 706, 708 that includes one or more SEU tolerant clock splitter circuits 200. Clock output pairs 710, 712 and 714, 716 from each clock driver 706, 708, respectively, are provided to registers 702, 704, respectively. Each clock output pair 710, 712 and 714, 716 represents one or more pairs of clock splitter circuit outputs 230, 232.

During normal operation, all latches of the registers 702, 704 can operate as scan-d flip flops (scan off) and can be set to select a data or logic input. When clock enables 234, 236 are high, both clock drivers 706 and 708 are enabled. Input clock PAO 204 is buffered and split in clock drivers 704, 706 and then passed as clock output pairs 710, 712 and 714, 716 to registers 702, 704, which are operating as scan dff registers.

In a typical cycle of clock PAO 204, input data from other logic (not shown) can be passed to register 702 on inputs $DI_0$–$DI_n$ 724. Data, latched in register 702 in the previous clock cycle, passes out of register 702 on outputs $DO_0$–$DO_n$ 726, propagating through logic 700 to inputs $DI_0$–$DI_n$ 728 of register 704. Register 704, in turn, can pass data that was latched in the previous clock cycle on outputs $DO_0$–$DO_n$ 730 to a subsequent logic function, also not shown. On the subsequent clock cycle, data from logic 700 can be latched in register 704 and, on the next subsequent cycle, register 704 can pass that latched data to subsequent logic.

FIG. 7B is an example timing diagram of a typical LSSD test for the cross sectional diagram of FIG. 7A. In the first test phase as represented in the period labeled 732, the latches operate as LSSD latches. Latches in the register 702 are set, as represented by SELECT, to select a SCANIN input, thus configuring register 702 as a first-in first-out serial register. Initially, the SEU clock splitter enables E0, E1 718 and 720 are low. Enables E0, E1 718 are driven high, individually, selecting one register 702 by enabling clock splitters 200 in clock splitter circuit 706. The clock signal outputs 714, 716 for unselected register 704 are held low, because enables E0, E1 720 are low in this example. So, in the first test phase 732, the enabled clock signal outputs 710, 712 clock register 702 to serially scan test data in on $SC_0$ 734 (which is the SCANIN input for the scan chain) until test data is loaded into register 702.

After loading test data into register 702, in test phase 736, enables E0, E1 718 are driven low to disable clocks 710, 712 and the latch data inputs are selected as represented by SELECT switching state. Then, enables E0, E1 720 are driven high to enable SEU clock splitters 200 in clock splitter circuit 708. After a single pulse on the PA0 clock 204, results of the test data on the logic are captured in the first level sensitive latches in register 704.

Next, in test phase 738, the SCANIN input 734 is selected again as represented by SELECT switching. The captured test results are serially scanned out on $DO_n$. Finally, the circuit is returned to normal operation in phase 740 as the data input is selected for all latches and both clock drivers 706, 708 are enabled.

Thus, the entire logic function 700 can be tested using either automated test pattern generation (ATPG) or level sensitive scan design (LSSD) techniques, while operating normally as a scan dff design that has additional, normally unavailable SEE hardening. Further, the preferred embodiment hybrid design has eliminated the LSSD need for individual A0, C0 clocks.

While the invention has been described in terms of preferred embodiments, those skilled in the art will recognize that the invention can be practiced with modification within the spirit and scope of the appended claims.

What is claimed is:

1. A clock splitter circuit having reduced single event effects sensitivity, comprising:

an event offset delay circuit; and a first event blocking filter and a second event blocking filter coupled to said event offset delay circuit, each filter being implemented to block SEU (single event upsets) events.

2. The clock splitter circuit according to claim 1, further comprising a first clock driver and a second clock driver coupled to said first event blocking filter and said second event blocking filter.

3. The clock splitter circuit according to claim 1, wherein said event offset delay circuit comprises:

first, second, third, fourth and fifth inverters coupled in series;

wherein an input to said first inverter is an undelayed clock signal and an output of said first inverter is an inverted undelayed clock signal;

wherein an output of said fourth inverter is a delayed clock signal;

wherein an output of said fifth inverter is an inverted delayed clock signal;

wherein the undelayed clock signal and the delayed clock signal are coupled to said first event blocking filter; and wherein the inverted undelayed clock signal and the inverted delayed clock signal are coupled to said second event blocking filter.

4. The clock splitter circuit according to claim 3, wherein each of said first and said second event blocking filters comprises:

three series coupled PFETs;

a PFET coupled in parallel with two of said three series connected PFETs; and four series coupled NFETs, a drain-source region of one of said four series coupled NFETs being coupled at a first of two in-phase outputs of said event blocking filter to a drain-source region of a third PFET of said three series coupled PFETs, a source-drain region of said third PFET being coupled to a second of the two in-phase outputs.

5. The clock splitter circuit according to claim 4, wherein said first PFET of said three series coupled PFETs is gated by the delayed clock signal and said second PFET of said three series coupled PFETs is gated by undelayed clock signal.

6. The clock splitter circuit according to claim 5, wherein a gate of said third PFET is coupled to ground.

7. The clock splitter circuit according to claim 6, wherein a gate of said parallel connected PFET is driven high to enable said event blocking filter.

8. The clock splitter circuit according to claim 7, wherein each of said first and second clock drivers is an inverting clock driver and wherein each of said clock drivers comprises:

a PFET, a source-drain region of said PFET coupled to a supply voltage, a gate of said PFET gated by the first of the in-phase outputs of said event blocking filter; and an NFET, a source-drain region of said NFET coupled to ground, a gate of said NFET gated by the second of the in-phase outputs, a drain-source region of said PFET coupled to a drain-source region of said NFET and coupled to an output of said clock driver.

9. A clock splitter circuit for providing an SEU (single event upsets) tolerant clock to latches in a space based environment, the clock splitter circuit comprising:

an event offset delay circuit receiving an undelayed clock signal and generating a delayed clock signal and the undelayed clock signal;

a first event blocking filter receiving and combining the undelayed clock signal and the delayed clock signal to provide a first and a second of two in-phase outputs for blocking SEU events; and a first clock driver being driven by the first and the second in-phase outputs to provide a clock driver output signal.

10. The clock splitter circuit according to claim 9, further comprising:

a second event blocking filter receiving an undelayed inverted clock signal and a delayed inverted clock signal from said event offset delay circuit; and a second clock driver being driven by said second event blocking filter.

11. The clock splitter circuit according to claim 10, wherein said even offset delay circuit generates the undelayed inverted clock signal and the delayed inverted clock signal, the undelayed clock signal and the delayed clock signal being provided to one of the first and the second in-phase outputs and the undelayed inverted clock signal and the delayed inverted clock signal being provided to the other of the first and the second in-phase outputs.

12. The clock splitter circuit according to claim 11, wherein a low signal at one of the first and the second in-phase outputs of said first and said second event blocking filters prevents the other of the first and the second in-phase outputs from being pulled low.

13. The clock splitter circuit according to claim 12, wherein said event offset delay circuit is a series of coupled inverters.

14. The clock splitter circuit according to claim 13, said event offset delay circuit is 5 series coupled inverters, the undelayed inverted clock signal being an output of a first of said 5 series coupled inverters, the delayed clock signal being an output of a fourth of said 5 series coupled inverters and the delayed inverted clock signal being an output of a fifth of said 5 series coupled inverters.

15. The clock splitter circuit according to claim 12, wherein each of said first and said second event blocking filters comprises:

three series coupled devices of a first conduction type;

four series coupled devices of a second conduction type, a conduction terminal of one of said three series coupled devices being coupled to a conduction terminal of said four series coupled devices; and a device of said first conduction type being coupled in parallel with two of said three series coupled devices.

16. The clock splitter circuit according to claim 15, wherein one of the first and the second in-phase outputs is at a coupling point of said parallel coupled device and the other of said pair of in-phase outputs is at said coupled of said three series coupled devices with said four series coupled devices.

17. The clock splitter circuit according to claim 16, wherein the devices of said first conduction type are P-type field effect transistors (FETs) and the devices of said second conduction type are N-type FETs, the first and the second in-phase outputs being separated by one of the three series coupled PFETs with its gate coupled to ground.

18. A clock splitter circuit for providing an SEU (single event upsets) tolerant clock to latches in a space-based environment, the clock splitter circuit comprising:

an event offset delay means for generating an undelayed inverted clock signal, a delayed clock signal and a delayed inverted clock signal responsive to an undelayed clock signal, the delayed clock signal being delayed from the undelayed clock signal and the inverted delayed clock being delayed from the undelayed inverted clock signal by a period of at least equal to a single event effect duration; and a pair of event blocking filters means for blocking single event effects in the undelayed clock signal, the undelayed inverted clock signal, the delayed clock signal or the delayed inverted clock signal and generating a pair of in-phase clock output signals therefrom.

19. The clock splitter circuit according to claim 18, further comprising:

a pair of clock driver means for providing a pair of non-overlapping clock signals responsive to a corresponding pair of in-phase clock output signals from said event blocking filters means.

20. The clock splitter circuit according to claim 19, wherein each of said pair of event blocking filter means comprises:

enable means for enabling said event blocking filter;

feedback means preventing said in-phase outputs from said other of the pair of event blocking filter from switching prematurely;

resistive means for resistively isolating the pair of in-phase outputs from each other; and means for comparing the delayed clock signal with the delayed and undelayed clock signals.

21. An integrated circuit (IC) chip, including an SEU (single event upsets) tolerant clock splitter, the clock splitter comprising:

an event offset delay generating an undelayed inverted clock signal, a delayed clock signal and a delayed inverted clock signal responsive to an undelayed clock signal, the delayed clock signal being delayed from the undelayed clock signal and the said inverted delayed clock being delayed from the undelayed inverted clock signal by a period of at least equal to a single event effect duration; and a pair of event blocking filters each generating a coupled pair of in-phase clock output signals, a first of said pair of event blocking filters receiving the undelayed clock signal and the delayed clock signal, generating a pair of inverted in-phase clock output signals and blocking single event effects from passing to the pair of generated inverted in-phase clock output signals, a second of said pair of event blocking filters receiving the undelayed inverted clock signal and the delayed inverted clock signal, generating a pair of uninverted in-phase clock output signals and blocking single event effects from passing to the pair of generated uninverted in-phase clock output signals, wherein the clock output in-phase signals from one of said pair of event blocking filters are low preventing the in-phase clock output signals from an other of said pair of event blocking filters from being driven low.

22. The integrated circuit chip according to claim 21, further comprising:

a pair of inverting clock drivers, the in-phase clock output signals from each of said pair of event blocking filters being coupled to a corresponding one of said pair of inverting clock drivers, each of said pair of inverting clock drivers providing a pair of non-overlapping clock output signals.

23. The integrated circuit chip according to claim 22, wherein each of said pair of event blocking filters comprises:

a pair of series coupled PFETs, said pair being gated by the delayed and the undelayed clock signals;

a PFET coupled in parallel with said pair of series coupled PFETs between a supply voltage and a first of the pair of in-phase clock output signals, said parallel coupled PFET being gated by an enable signal;

a grounded gate PFET, a source-drain region of said grounded gate PFET being coupled to the first of the pair of in-phase clock output signals, the drain-source region of said grounded gate PFET being coupled to a second of the pair of in-phase clock output signals; and four series coupled NFETs coupled between the second of said in-phase clock output signals and ground, a gate of one of said NFETs being coupled to the second of the pair of in-phase outputs of the other of said pair of said event blocking filters.

24. The integrated circuit chip according to claim 22, each said clock drivers comprising:

a PFET, a source-drain region of said PFET coupled to a supply voltage, a gate of said PFET gated by the first of the pair of in-phase clock output signals; and an NFET, a source-drain region of said NFET coupled to ground, a gate of said NFET gated by the second of the pair of in-phase clock output signals, a drain-resource region of said PFET coupled to a drain-source region of said NFET and coupled to a clock driver output.

25. A method of clocking an integrated circuit chip comprising:

d) generating an undelayed complementary pair of clock signals;

e) generating a delayed complementary pair of clock signals;

f) generating a first in-phase clock signal pair from an uninverted, undelayed clock signal of the undelayed complementary pair of clock signals and an uninverted delayed clock signal of the delayed complementary pair of clock signals; and d) generating a second in-phase clock signal pair from an inverted undelayed clock signal of the undelayed complementary pair of clock signals and an inverted delayed clock signals of the delayed complementary pair of clock signals;

wherein the first and the second in-phase clock signal pairs generated substantial filtering of SEU (single event upsets) events.

26. The method of claim 25, further comprising:

e) generating a first latch clock signal from said first in-phase clock signal pair; and f) generating a second latch clock signal from said first in-phase clock signal pair, the first and the second latch clock signals clocking said integrated circuit.

27. The method of claim 25, wherein the first and second latch clocks are non-overlapping clocks.

28. The method of claim 26, wherein both the first and the second in-phase clock signal pairs must be high before either can be pulled low.

29. The method of claim 28, said step (b) of generating the delayed complementary pair of clock signals further comprises enabling clock generation.

30. A clock splitter circuit having reduced single event effects sensitivity, comprising:

an event offset delay circuit; and first and second event blocking filters coupled to said event offset delay circuit and generating a pair of undelayed complementary clock signals, wherein an SEU (signal event upsets) upset occurring in an input clock tree prior to said first and the second event blocking filters is not propagated to said pair of substantially undelayed complementary clock signals.

31. The clock splitter circuit of claim 30, wherein said event offset delay circuit comprises:

first, second, third, fourth and fifth inverters coupled in series;

wherein an input to said first inverter is an undelayed clock signal and an output of said first inverter is an inverted undelayed clock signal;

wherein an output of said fourth inverter is delayed from undelayed clock signal by a delay approximately equal to a duration of an upset;

wherein an output of said fifth inverter is an inverted delayed clock signal delayed from said inverted undelayed clock signal by a delay approximately equal to the duration of an upset;

wherein the undelayed clock signal and the delayed clock signal are coupled to said first event blocking filter; and wherein the inverted undelayed clock signal and the inverted delayed clock signal are coupled to said second event blocking filter.

* * * * *